United States Patent
Jimarez et al.

(10) Patent No.: US 6,757,967 B2
(45) Date of Patent: Jul. 6, 2004

(54) METHOD OF FORMING A CHIP ASSEMBLY

(75) Inventors: Lisa J. Jimarez, Newark Valley, NY (US); Miguel A. Jimarez, Newark Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/119,134

(22) Filed: Apr. 9, 2002

(65) Prior Publication Data

US 2002/0108768 A1 Aug. 15, 2002

Related U.S. Application Data

(62) Division of application No. 09/727,271, filed on Nov. 30, 2000, now Pat. No. 6,407,334.

(51) Int. Cl.[7] .............................................. H05K 3/30
(52) U.S. Cl. ......................... 29/840; 29/530; 29/760; 29/831; 29/841; 29/852; 29/854; 174/52.4; 257/713; 257/778; 269/900; 361/719
(58) Field of Search ........................... 29/830, 831, 846, 29/852, 854, 837–841, 530, 827, 760; 257/704, 706, 707, 713; 361/719; 438/122, 119; 228/56.3; 156/297, 299; 174/52.2, 52.4; 269/47, 53, 900, 903

(56) References Cited

U.S. PATENT DOCUMENTS

| | | | |
|---|---|---|---|
| 4,788,767 A | * 12/1988 | Desai et al. | .................. 29/830 |
| 5,371,404 A | 12/1994 | Juskey et al. | ................ 257/659 |
| 5,777,847 A | * 7/1998 | Tokuno et al. | ............... 361/705 |
| 5,796,170 A | 8/1998 | Marcantonio | ................ 257/786 |
| 5,811,317 A | * 9/1998 | Maheshwari et al. | .......... 29/827 |
| 5,866,943 A | 2/1999 | Mertol | ........................ 257/712 |
| 5,879,786 A | * 3/1999 | Budnaitis et al. | ............ 257/703 |
| 5,895,967 A | 4/1999 | Stearns et al. | ............... 257/691 |
| 5,955,789 A | 9/1999 | Vendramin | .................... 257/786 |
| 6,020,221 A | * 2/2000 | Lim et al. | .................... 438/125 |
| 6,051,888 A | * 4/2000 | Dahl | ........................... 257/712 |
| 6,144,101 A | * 11/2000 | Akram | ........................ 257/778 |
| 6,313,521 B1 | * 11/2001 | Baba | ........................... 257/678 |
| 6,437,436 B2 | * 8/2002 | Wang et al. | ................. 257/698 |
| 6,504,096 B2 | * 1/2003 | Okubora | .................... 174/52.2 |

* cited by examiner

Primary Examiner—Peter Vo
Assistant Examiner—Donghai D. Nguyen
(74) Attorney, Agent, or Firm—William N Hogg

(57) ABSTRACT

A chip mounting assembly is provided which includes a dielectric substrate having at least one integrated circuit (I/C) chip mounted thereon. An electrically conductive cover plate is in contact with all the chips with an electrically non-conducting thermally conducting adhesive. A stiffener member is provided which is mounted ante substrate and laterally spaced from the integrated circuit chip. At least one electrically conductive ground pad is formed an the substrate. The stiffener member has at least one through opening therein and electrically conductive adhesive extending through each opening and contacting the cover plate and each ground pad. The invention also provides a method of forming such an I/C chip assembly.

12 Claims, 4 Drawing Sheets

METHOD OF FORMING A CHIP ASSEMBLY

CROSS REFERENCE TO RELATED APPLICATION

This application is a divisional of application Ser. No. 09/727,271, filed Nov. 30, 2000, now U.S. Pat. No. 6,407,334 B2.

BACKGROUND INFORMATION

1. Field of the Invention

This invention relates generally to I/C chip mounting structures which include a substrate and an electrically and thermally conducting cover plate and a method of manufacturing the same. In even more particular aspects, this invention relates to an I/C chip assembly which electrically insulates the chip from the cover plate but provides grounding of the substrate to the cover plate.

2. Background Information

In the packaging of I/C chips, there has developed a need for a chip package that includes a cover plate for the assembly, which cover plate is thermally conducting for heat transfer, and also electrically conducting for grounding the substrate, while preventing the chip itself from being electrically grounded to the cover plate, so that the cover plate can act as both a heat sink for the chip and also an electrical ground for the substrate.

SUMMARY OF THE INVENTION

According to the present invention, a chip mounting assembly is provided which includes a dielectric substrate having at least one integrated circuit (I/C) chip mounted thereon. An electrically conductive cover plate is in contact with said at least one chip by an electrically non-conducting thermally conducting material. A stiffener member is provided which is mounted on the substrate and laterally spaced from the integrated circuit chip. At least one electrically conductive ground pad is formed on the substrate. The stiffener member has at least one through opening therein and electrically conductive material extending through said at least one opening and contacting said cover plate and said at least one ground pad. The invention also provides a method of forming such an I/C chip assembly.

DESCRIPTION OF THE PREFERRED EMBODIMENT

The present invention provides an I/C chip assembly which includes a substrate mounting one or more I/C circuit chips and, optionally, other devices, wherein the chip assembly includes a cover plate which acts as a heat sink by being connected by an electrically non-conductive, thermally conductive adhesive to the chip, and which cover plate also is connected by an electrically conductive adhesive to ground pads on the substrate to provide a ground for the substrate.

Figure 1:
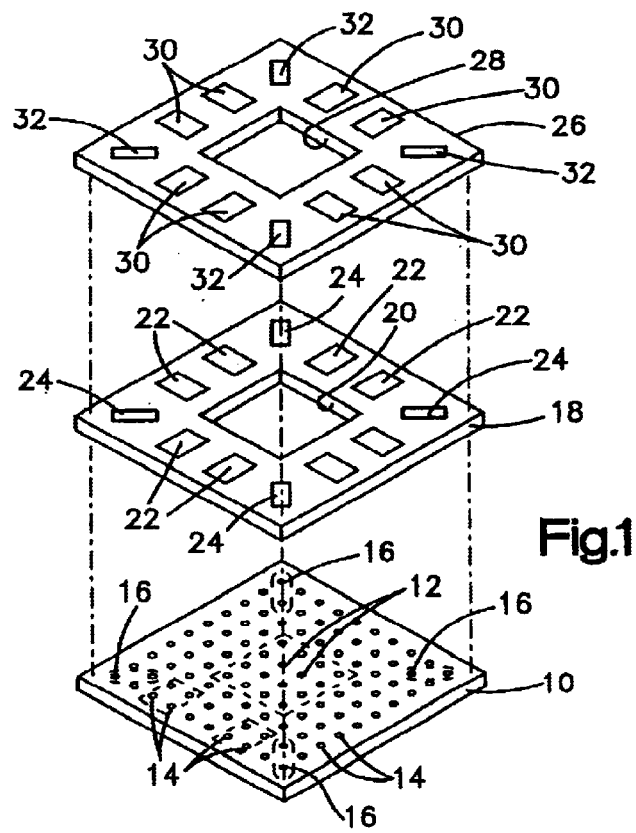
FIG. 1 is an exploded view of a substrate, a stiffener member and a thermal adhesive in position for lamination as a first step in the process of forming the device of the present invention.

As seen in FIG. 1, a generally conventional dielectric substrate 10 is provided which has a series of mounting pads formed thereon (other circuitry and features have been omitted for clarity). The mounting pads include a group of mounting-pads 12 which are for mounting an I/C chip; a group of mounting pads 14 for mounting capacitors, and a group of mounting pads 16 for providing electrical connections for grounding purposes to a cover plate. The substrate 10 can be made of any conventional dielectric material, such as FR4, polyimide, polytetrafluoroethylene or other dielectric materials, A dry film of adhesive material 18 is provided. The film of material 18 has a central opening 20, a plurality of side openings 22 and a plurality of corner openings 24 formed therein. The opening 20 corresponds to and is in alignment with the set of mounting pads 12; the openings 22 correspond to and are in alignment with the mounting pads 14, and the openings 24 correspond to and are in alignment with the ground pads 16. Preferably, the film of material 18 is a dry film adhesive, such as a polyimide/acrylic adhesive of the type sold under the trademark Pyralux by duPont. However, any film adhesive which can have openings formed therein can be used.

A stiffener member 26 is provided which preferably is formed of stainless steel, preferably 400 Series, and, more particularly, 420. The stiffener 26 member has a central opening 28 which corresponds to and aligns with the opening 22 in the film material 18, side openings 30 which correspond to and align with the openings 22 in the film 18 and corner openings 32 which correspond to and align with openings 24 the film 18.

Figure 2:
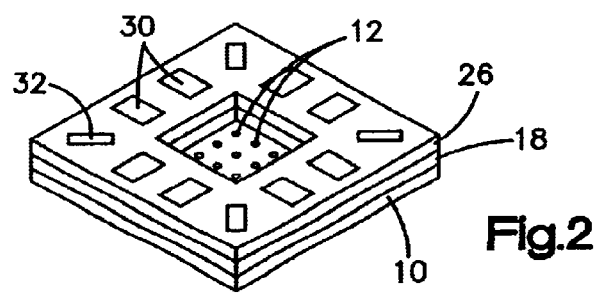
FIG. 2 is a perspective view showing the substrate stiffener member and a film of adhesive material laminated together to form the basis for forming the present invention.
Figure 3:
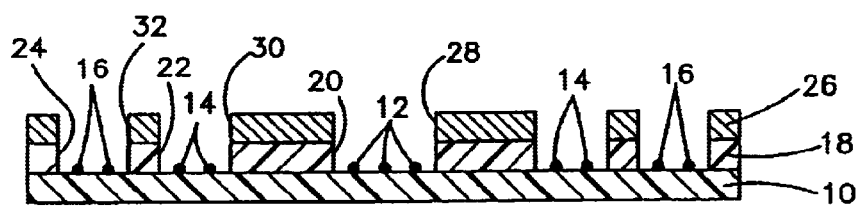
FIGS. 3–10 are longitudinal, sectional views, somewhat diagrammatic, showing the steps in forming an I/C chip assembly according to this invention.
Figure 11:
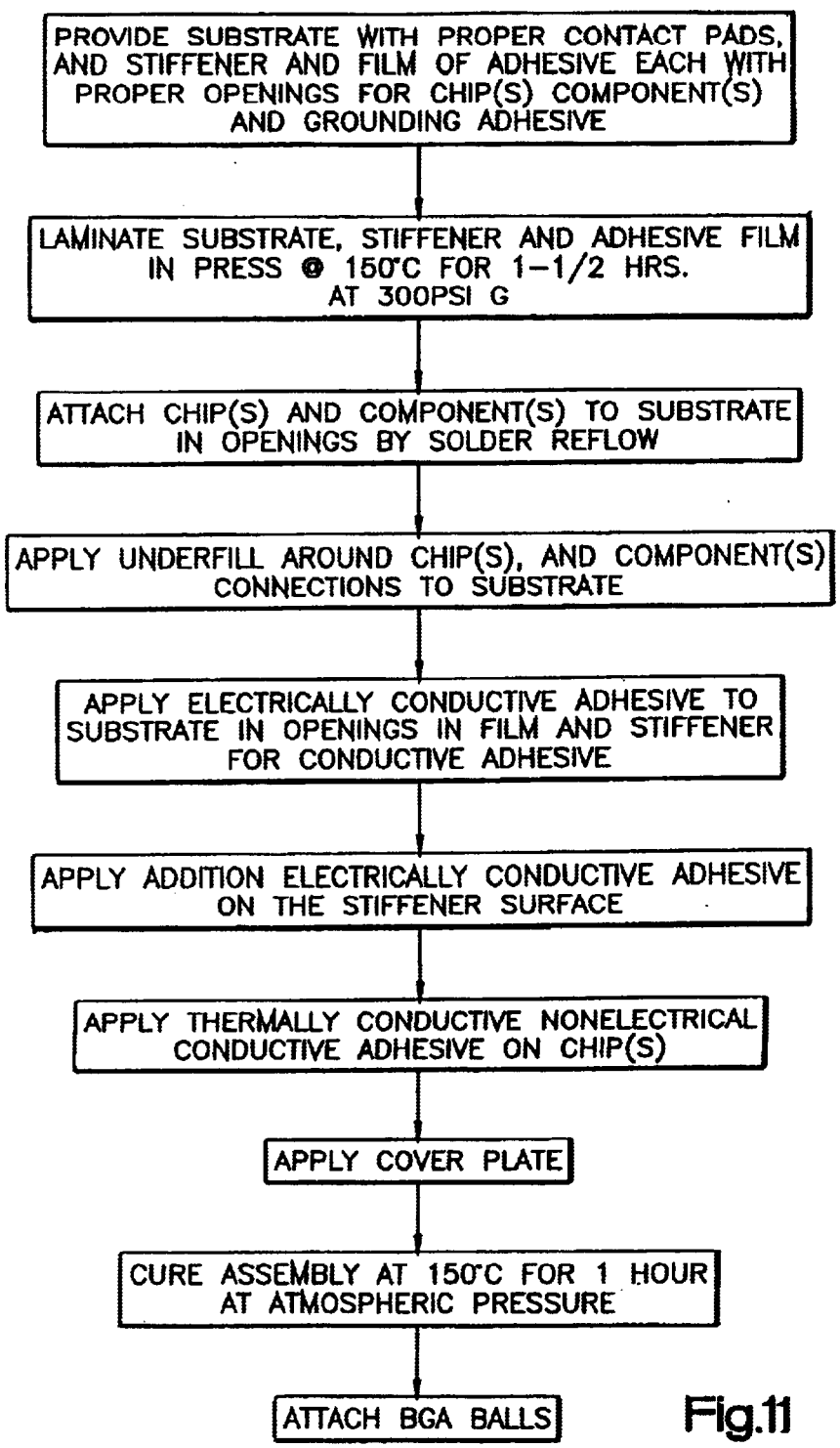
FIG. 11 is a flow chart of the steps involved in preparing the chip assembly.

The substrate 10, film 18 and stiffener member 26 are laid up in lamination press and heated to about 150° C. at 300 psi gauge for about an hour and half to form a laminate of these three items, as shown in FIGS. 2 and 3. (The preferred sequence for forming the chip assembly is shown in FIG. 11).

Alternatively, instead of a separate dry film, adhesive 18 can be replaced with a liquid adhesive which can be applied to the stiffener member 26, and this will be used as the adhesive to secure this stiffener to the substrate. The liquid adhesive cat be any one of several adhesives; a particularly useful adhesive is GE 3281 manufactured by General Electric Corporation.

Figure 4:
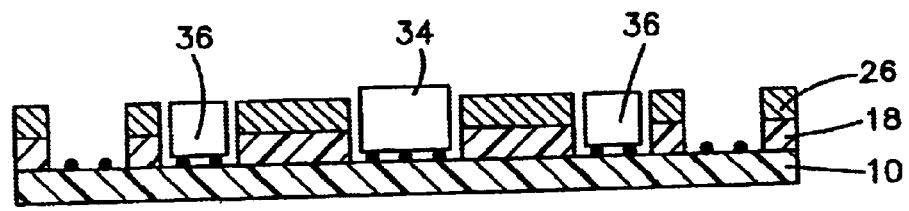
Figure 5:
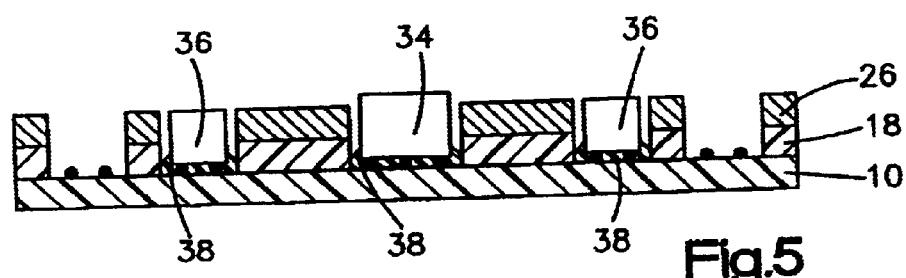

Following the lamination process, an I/C chip 34 is mounted on the pads 12, and capacitors 36 are mounted on the pads 14 by conventional solder reflow techniques, as shown in FIG. 4. Following the attachment of the I/C chip 34 and capacitors 36, conventional underfill material 38 is applied around the solder connections of the chip 34 to the substrate and the capacitors 36 to the substrate, as shown in FIG. 5. Conventional underfill material preferably is an epoxy with silica filler, such as Namics 8437-2 sold by the Namics Corporation, although other materials can be used. The Namics 8437-2 underfill 38 is cured at about 150° for about one hour at atmospheric pressure.

Figure 6:
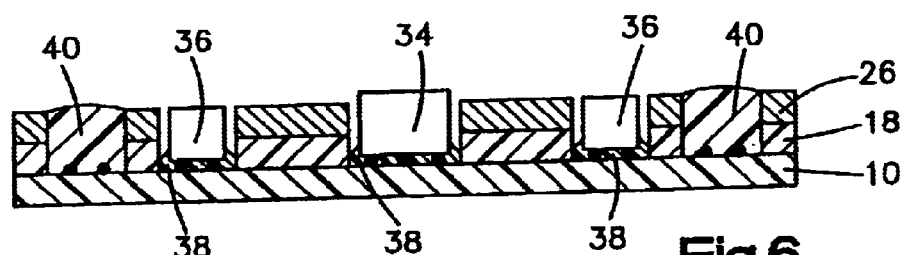

Following the application of the underfill 38, a conductive material such as a conductive adhesive 40 is applied over each set of the ground pads 16 and in the openings 24 and 32 of the dielectric film 18 and stiffener member 26, respectively, as shown in FIG. 6. Any type of conductive adhesive can be used. A preferred adhesive is Able Stik 965-1L, which is an epoxy with silver flakes therein, sold by Able Stik Chemical Corporation. Other conductive materials such as conductive inks may be used.

Figure 7:
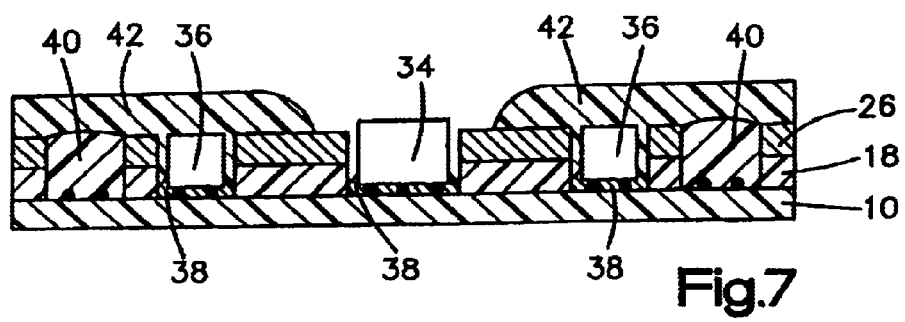

Following the deposition of the conductive epoxy 40 on the ground pads 16, a generally circumferential layer of electrically conductive material 42, preferably the same material as the material 40, is provided which is disposed over both the material 40 and the capacitors 36 and in the openings 22 and 30 in the adhesive film 18 and the stiffener member 26, respectively. Care must be taken that this conductive material 42 does not extend over and into contact with the I/C chip 34 since the conductive material 42 eventually will serve to provide the electrical connection between the ground pads 16 and the cover plate, which will be described presently, and which would short out the chip 34 and cause the assembly to be inoperable. This step in the process is shown in FIG. 7.

Figure 8:
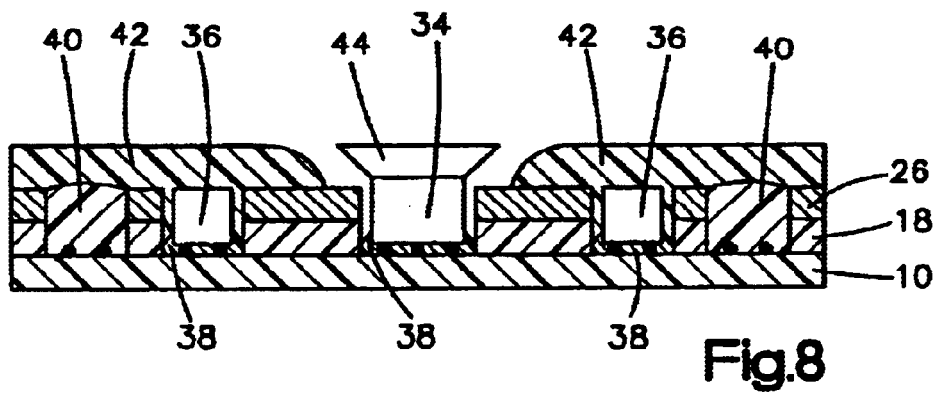

Following the deposition of the conductive material 42, a non-electrically conductive, thermally conductive material, preferably an adhesive 44 is applied over the I/C chip 34 and in the openings 20 and 28 in the adhesive film 18 and 26, respectively. The adhesive material 44 is preferably a silicone material having a filler therein. A particularly useful material is sold by General Electric Corporation under the trademark GE 3281. However, other thermally conductive, non-electrically conducting materials can be used. This step is shown in FIG. 8.

Figure 9:
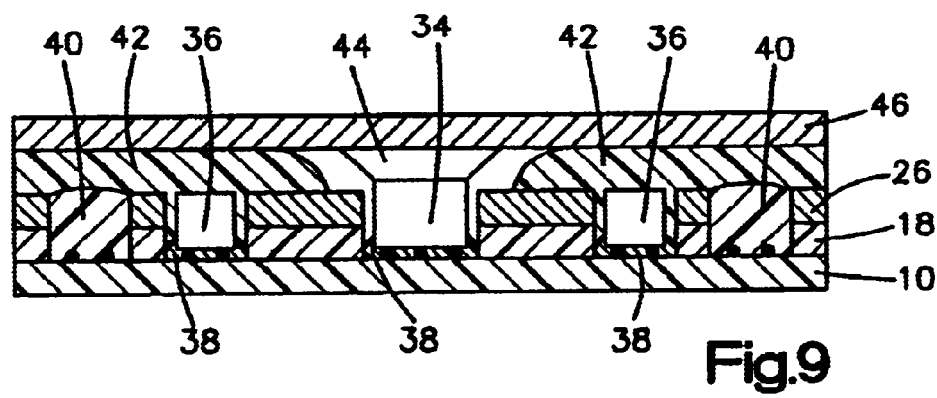

A cover plate 46 is placed overlying the adhesives 42 and 44. The cover plate 46 functions both as a grounding device and as a heat sink and, thus, a good electrically and thermally conducting material is preferred for the cover plate 46. A particularly useful material is copper, although other metal plates could be used. As can be seen in FIG. 9, the cover plate 46 is electrically connected through adhesives 42 and 40 to the ground pads 16 on the substrate 10, and the I/C chip 34 is connected through electrically non-conducting, thermally conductive adhesive 44 to the cover plate 46. Thus, the cover plate 46 operates both as a heat sink with respect to the I/C chip 34 and a ground connection with respect to the substrate 10. The assembly is cured for approximately one hour at about 150° C. at atmospheric pressure to provide the final heat chip assembly.

Figure 10:
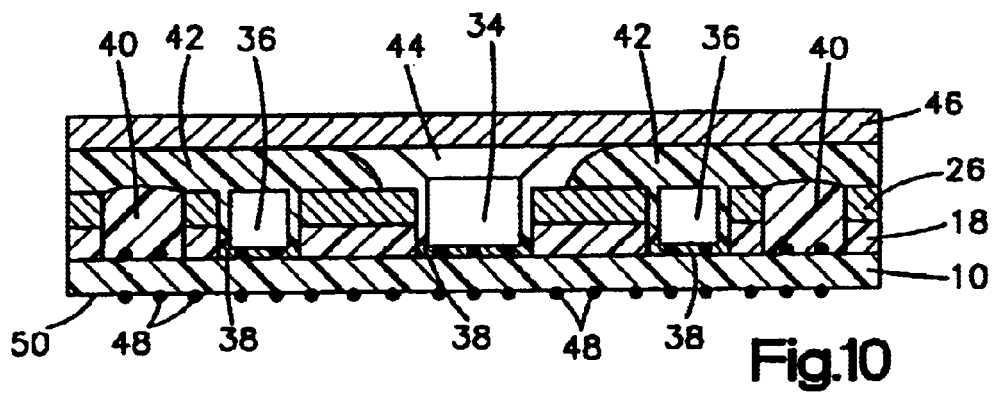

A plurality of ball grid array solder ball connectors 48 are applied to the bottom surface 50 of the substrate 10, as shown in FIG. 10. These provide the necessary connections to attach the I/C chip assembly to a printed wiring board.

The various steps of forming the I/C chip assembly are shown in FIG. 11.

While the invention has been described using but a single I/C chip and various capacitors, it is to be understood that several I/C chips could be mounted on the substrate as well as other devices besides or in addition to capacitors. The important thing is that the conductive adhesive not come in contact with any of the I/C chips or any other device which could be unintentionally electrically grounded. Therefore, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A method of forming a chip carrier and chip assembly comprising the steps of:
    a) providing a substrate having at least one set of chip mounting pads and grounding pads;
    b) providing a stiffener member having at least one chip receiving opening and at least one electrical conductive material receiving opening;
    c) bonding said stiffener member to said substrate with said at least one chip receiving opening in alignment with at least one of said chip mounting pads and with each electrically conductive material opening in alignment with one of said ground pads;
    d) mounting an I/C chip on each set to at least some of said chip mounting pads in each set;
    e) dispensing electrically conductive material into each electrically conductive material receiving opening in contact with each grounding pad associated therewith;
    f) dispensing electrically non-conductive, thermally conductive material into said chip receiving opening and onto said I/C chip; and
    g) applying an electrically conductive and thermally conductive cover plate over said stiffener member in contact with said electrically conductive material and said thermally conductive electrically non-conductive material.

2. The method of claim 1 comprising the step of applying ball grid array balls on said substrate on the opposite surface on which each said I/C chip is mounted.

3. The method of claim 1 wherein each I/C is mounted to said chip mounting pads by solder ball connection.

4. The method of claim 3 further comprising the step of dispensing underfill material around the solder ball connection of the I/C chip to the substrate.

5. The method as defined in claim 1 wherein said electrically conductive material is an adhesive.

6. The method as defined in claim 5 wherein said electrically conductive adhesive has metal flakes therein.

7. The method of claim 1 wherein said thermally conductive electrically non-conductive material is an adhesive.

8. A method of forming a chip carrier and chip assembly comprising the steps of:
    a) providing a substrate having at least one set of chip mounting pads and grounding pads;
    b) providing a stiffener member having at least one chip receiving opening and at least one electrical conductive material receiving opening;
    c) banding said stiffener member to said substrate with a dry film adhesive, with said at least one chip receiving opening in alignment with at least one of said chip mounting pads and with each electrically conductive material opening in alignment with one of said ground pads;
    d) mounting an I/C chip on each of said sets to at least some of said chip mounting pads in each set;
    e) dispensing electrically conductive material into each electrically conductive material receiving opening in contact with the grounding pad associated therewith;
    f) dispensing electrically non-conductive, chemically conductive material into said chip receiving opening and onto said I/C chip; and
    g) applying an electrically conductive and thermally conductive cover plate over said stiffener member in contact with said electrically conductive material and said thermally conductive electrically non-conductive material.

9. The method of claim 8 wherein said dry film adhesive is provided with openings corresponding to and in alignment with the openings in said stiffener member.

10. A method of forming a chip carrier and chip assembly comprising the steps of:
    a) providing a substrate having at least one set of chip mounting pads and grounding pads;

b) providing a stiffener member having at least one chip receiving opening and at least one electrical conductive material receiving opening, wherein said stiffener member includes at least one additional component opening, and mounting at least one additional component on said substrate and in said chip component opening;

c) bonding said stiffener member to said substrate with said at least one chip receiving opening in alignment with at least one of said chip mounting pads and with each electrically conductive material opening in alignment with one of said ground pads;

d) mounting an I/C chip on each of said sets to at least some of said chip mounting pads in each set;

e) dispensing electrically conductive material into each electrically conductive material receiving opening in contact with the grounding pad associated therewith;

f) dispensing electrically non-conductive, thermally conductive material into said chip receiving opening and onto said I/C chip; and g) applying an electrically conductive and thermally conductive cover plate over said stiffener member in contact with said electrically conductive material and said thermally conductive electrically non-conductive material.

11. A method of forming a chip carrier and chip assembly comprising the steps of:

a) providing a substrate having at least one pet of chip mounting pads and grounding pads;

b) providing a stiffener member having at least one chip receiving opening and at least one electrical conductive material receiving opening;

c) bonding said stiffener member to said substrate with said at least one chip receiving opening in alignment with at least one of said chip mounting pads and with each electrically conductive material opening in alignment with one of said ground pads;

d) mounting an I/C chip on each of said sets to at least some of said chip mounting pads in each set;

e) dispensing electrically conductive material into each electrically conductive material receiving opening in contact with the grounding pad associated therewith;

f) dispensing electrically non-conductive, thermally conductive material into said chip receiving opening and onto said I/C chip;

g) applying an electrically conductive and thermally conductive cover plate over said stiffener member in contact with said electrically conductive material and said thermally conductive electrically non-conductive material; and h) comprising the step of dispensing additional electrically conductive material on said stiffener member before applying said cover plate.

12. A method of forming a chip carrier and chip assembly comprising the steps of:

a) providing a substrate having at least one set of chip mounting pads and grounding pads;

b) providing a stiffener member having at least one chip receiving opening and at least one electrical conductive material receiving opening;

c) bonding said stiffener member to said substrate with a liquid adhesive, with said at least one chip receiving opening in alignment with at least one of said chip mounting pads and with each electrically conductive material opening in alignment with one of said ground pads;

d) mounting an I/C chip on each of said sets to at least some of said chip mounting pads in each set;

e) dispensing electrically conductive material into each electrically conductive material receiving opening in contact with the grounding pad associated therewith;

f) dispensing electrically non-conductive, thermally conductive material into said chip receiving opening and onto said I/C chip; and g) applying an electrically conductive and thermally conductive cover plate over said stiffener member in contact with said electrically conductive material and said thermally conductive electrically non-conductive material.

* * * * *